(12) United States Patent
Yoon et al.

(10) Patent No.: US 9,577,645 B2
(45) Date of Patent: Feb. 21, 2017

(54) DRIVER CIRCUIT FOR OUTPUTTING PHOTON COUNTING INCLUDING A MULTIPLEXER, INVERTER AND POWER SUPPLY

(71) Applicant: Samsung Electronics Co., Ltd., Suwon-Si, Gyeonggi-Do (KR)

(72) Inventors: Dae-kun Yoon, Daegu (KR); Young Kim, Yongin-si (KR); Chae-hun Lee, Suwon-si (KR); Chang-jung Kim, Yongin-si (KR); Jae-chul Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 512 days.

(21) Appl. No.: 13/894,526

(22) Filed: May 15, 2013

(65) Prior Publication Data

US 2014/0117202 A1    May 1, 2014

(30) Foreign Application Priority Data

Oct. 30, 2012  (KR) ................ 10-2012-0121544

(51) Int. Cl.
*H03K 21/00*   (2006.01)
*G01T 1/24*    (2006.01)
*H03K 21/10*   (2006.01)
*G01J 1/44*    (2006.01)

(52) U.S. Cl.
CPC ........... *H03K 21/10* (2013.01); *G01J 1/44* (2013.01); *G01T 1/247* (2013.01)

(58) Field of Classification Search
CPC  G01J 2001/442; G01J 1/44; G01J 2001/4413; H04N 5/3355; H04N 5/3742; H04N 5/374; H04N 5/378; H01L 27/14676; G01T 1/24; G01T 1/2928; G01T 1/247; G01T 1/17; G01T 1/18; H03K 21/00
USPC ............... 250/208.1, 214 R, 370.08, 370.01, 206,250/371.214 DC
See application file for complete search history.

(56) References Cited

U.S. PATENT DOCUMENTS

| | | | |
|---|---|---|---|
| 4,114,499 A * | 9/1978 | von Valtier | G10H 1/04 381/62 |
| 4,802,135 A * | 1/1989 | Shinoda | G11C 7/1021 365/22 |
| 5,665,959 A | 9/1997 | Fossum et al. | |
| 6,362,482 B1 | 3/2002 | Stettner et al. | |
| 6,874,689 B2 * | 4/2005 | Blake | G06K 7/10643 235/462.3 |

(Continued)

FOREIGN PATENT DOCUMENTS

| | | |
|---|---|---|
| JP | 2011-071958 A | 4/2011 |
| JP | 2011-097581 A | 5/2011 |
| KR | 10-1019164 B1 | 3/2011 |

OTHER PUBLICATIONS

Search Report for corresponding European Application No. 13181378.4 dated Mar. 18, 2014.

*Primary Examiner* — Que T Le
*Assistant Examiner* — Jennifer Bennett

(57) ABSTRACT

A driver circuit outputs a result of classifying and counting photons based on one or more energy levels to a column line. The driver circuit includes a multiplexer for receiving the result from a counter, a driving inverter for receiving a signal from the multiplexer and a power supply, and a switch connected between the power supply and an input terminal of the driving inverter.

21 Claims, 5 Drawing Sheets

(56) References Cited

U.S. PATENT DOCUMENTS

| | | |
|---|---|---|
| 7,342,233 B2 | 3/2008 | Danielsson et al. |
| 7,355,440 B1 * | 4/2008 | Santurkar .......... H03K 19/0016 |
| | | 326/38 |
| 7,479,639 B1 | 1/2009 | Shahar et al. |
| 7,488,945 B2 | 2/2009 | Li et al. |
| 2003/0197799 A1 | 10/2003 | Dyas et al. |
| 2004/0017224 A1 * | 1/2004 | Tumer ................... H03F 3/087 |
| | | 327/51 |
| 2007/0297567 A1 | 12/2007 | Takenaka et al. |
| 2010/0060767 A1 | 3/2010 | Okamoto |
| 2010/0226495 A1 * | 9/2010 | Kelly ............... G11B 20/00086 |
| | | 380/30 |
| 2011/0235771 A1 | 9/2011 | Aull et al. |
| 2012/0044398 A1 | 2/2012 | Chou et al. |

* cited by examiner

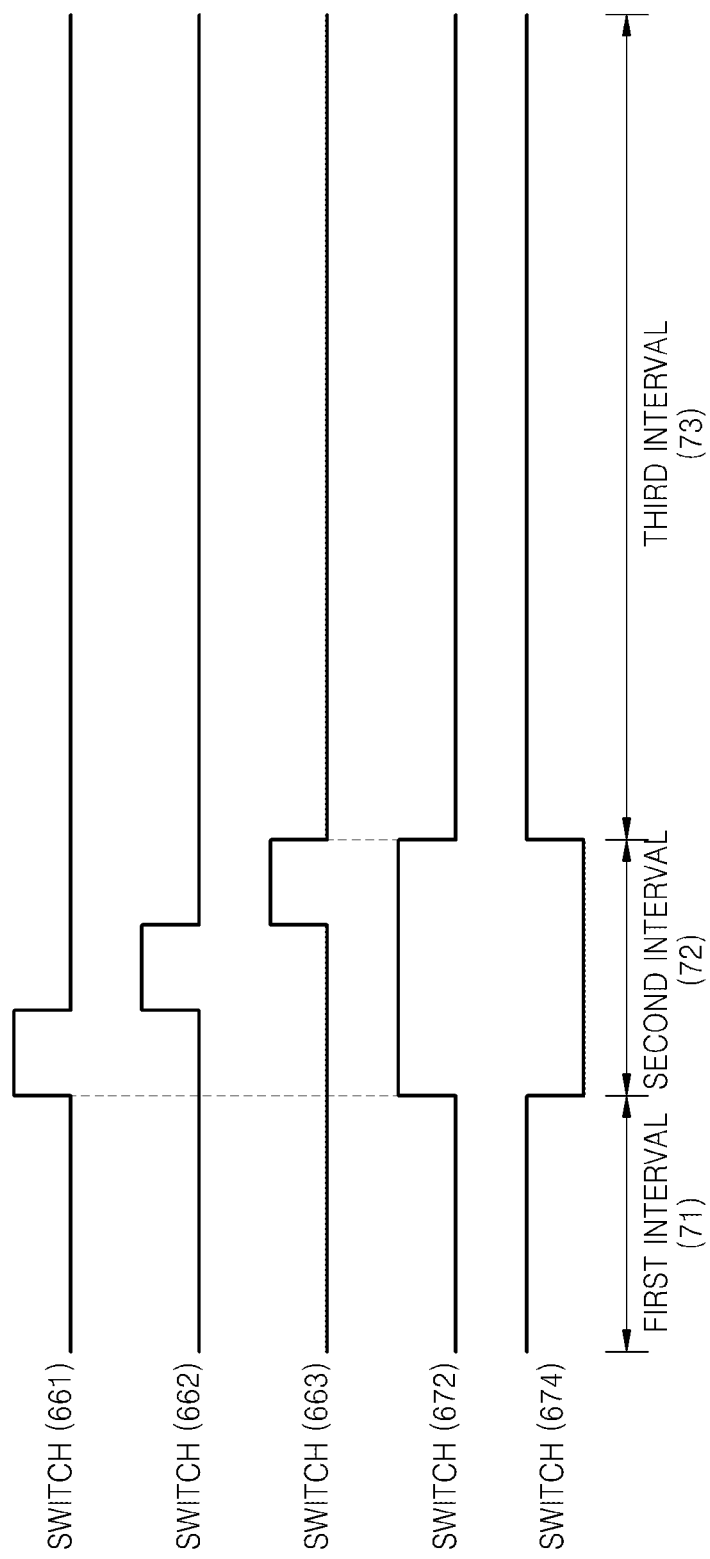

DRIVER CIRCUIT FOR OUTPUTTING PHOTON COUNTING INCLUDING A MULTIPLEXER, INVERTER AND POWER SUPPLY

CROSS-REFERENCE TO RELATED APPLICATIONS

This application claims the benefit of Korean Patent Application No. 10-2012-0121544, filed on Oct. 30, 2012, in the Korean Intellectual Property Office, the disclosure of which is incorporated herein in its entirety by reference.

BACKGROUND

1. Field

The present disclosure relates to a driver circuit and a readout circuit configured to output to column lines the result of classifying photons according to their energy levels and counting the number of photons for each energy level.

2. Related Art

Radiation medical devices are being widely used and developed. An example of a radiation medical device is an X-ray imaging system, which exists in analog and digital forms. The change from analog to digital may be largely attributed to a rapid advancement of technology related to X-ray detectors, which are the core components of X-ray imaging systems.

Digital X-ray detection technologies are mainly classified into ones that perform an indirect detection method and ones that perform a direct detection method. In an indirect detection method, X-rays are first converted into visible light and then into electrical signals to produce an image. In a direct detection method, X-ray signals are directly converted into electrical signals to generate an image.

The direct detection method may be implemented in various modes including integration mode and photon counting mode. In the integration mode, electrical signals are accumulated for a time to produce an image signal. In the photon counting mode, the number of incoming X-ray photons is counted to produce an image signal. Recently, research has been very actively conducted on the photon counting mode because it allows generation of an image for each of a plurality of X-ray energy levels with one shot imaging and provides high quality images with low X-ray exposure.

SUMMARY

One or more embodiments described herein provide a driver circuit and a readout circuit to output, to column lines, a result of classifying photons according to their energy levels and counting the number of photons for each energy level.

According to one embodiment, a driver circuit for outputting the result of classifying and counting photons according to their energy levels to a column line includes a multiplexer for receiving the result from a counter; a driving inverter for receiving a signal from the multiplexer and a power supply; and a first switch connected between the power supply and an input terminal of the driving inverter.

The driving inverter may receive the signal from the multiplexer at a first time and a power signal from the power supply at a second time different from the first time. The first and second times may be consecutive times, and the driving inverter may be in a state different from a floating state based on the power signal received at the second time.

According to another embodiment, a readout circuit includes an analog circuit for classifying photons incident on a sensor according to their energy levels; a digital circuit for counting the photons based on a signal received from the analog circuit; and a driver circuit for outputting the result of counting stored in the digital circuit to a column line. The driver circuit operates at different time than the analog or digital circuit.

Operation of the multiplexer and driving inverter may be controlled to prevent unnecessary power dissipation in the driving inverter. Also, an input node of the driving inverter may be maintained low or high, to thereby prevent the driving inverter from floating.

Furthermore, a readout circuit according to one or more embodiments may be configured such that the analog or digital circuit may operate at different time than the driver circuit, thereby preventing unnecessary power dissipation in the driver circuit.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 7 shows a timing diagram for switches in FIG. 6.

DETAILED DESCRIPTION OF EXAMPLE EMBODIMENTS

Figure 1:
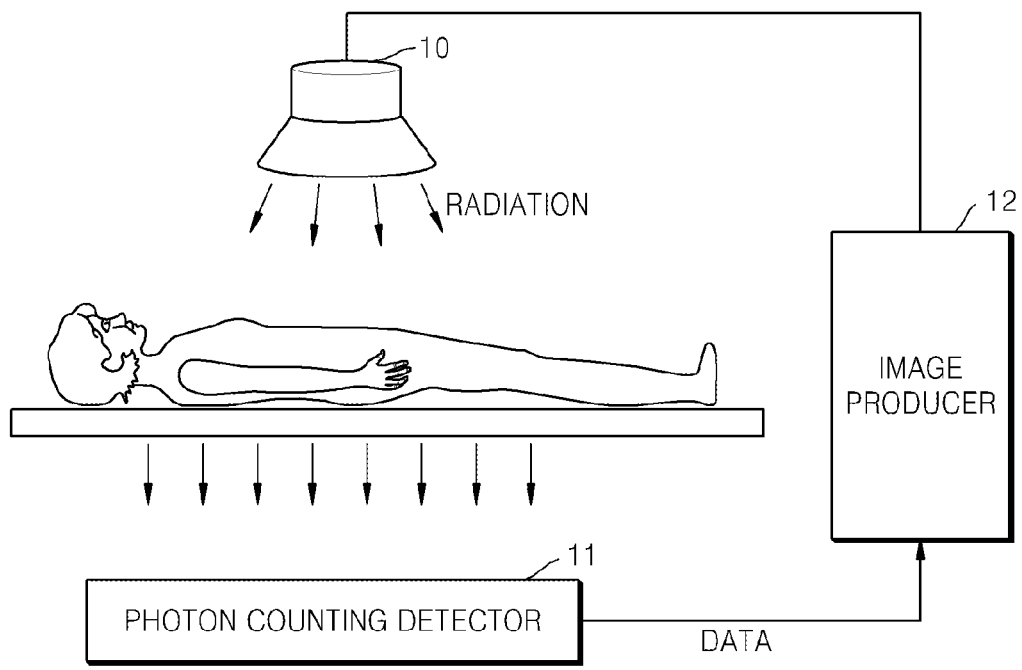
FIG. 1 shows one embodiment of a medical imaging system.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as "directly connected" or "directly coupled" to another element, there are no intervening elements present. Other words used to describe the relationship between elements should be interpreted in like fashion ("between" versus "directly between", "adjacent" versus "directly adjacent", etc.).

In the drawings, it is understood that the thicknesses of layers and regions may be exaggerated for clarity. It will also be understood that when a layer is referred to as being "on" another layer or substrate, it can be directly on the other layer or substrate or intervening layers may also be present. Like reference numerals in the drawings denote like elements, and thus their description will not be repeated. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved FIG. 1 shows one embodiment of a medical imaging system which includes a radiation generator 10, a photon counting detector 11, and an image producer 12. The medical imaging system detects multi-energy radiation which permeates an object (such as a human body) and produces an image for each of a plurality of energy levels. The image is produced based on the result of classifying photons contained in the multi-energy radiation according to their energy levels and by counting the number of photons for each energy level.

More specifically, the medical imaging system classifies the photons in the multi-energy radiation permeating an object according to their energy levels, counts the photons in each level, and uses the number of counted photons for each energy level to produce a medical image for each energy level.

The amount of radiation absorbed by the object may vary depending on the type and density of the object irradiated with the multi-energy radiation, or an energy level of the radiation. For example, bones may absorb X-rays very well, but tissues such as muscles may allow more X-rays to pass through. In this case, the photons are contained in the radiation generated by the radiation generator 10. Thus, the number of photons detected when they pass through a bone is different from the number of photons detected when they pass through another tissue in the human body.

Furthermore, the number of photons for each energy level, which are detected when they pass through a bone and another tissue, may vary according to energy levels of photons in the radiation generated by the radiation generator 10.

The image producer 12 produces X-ray images clearly distinguishing between body tissues by using the result of classifying photons according to their energy levels and counting the number of photons, wherein the result is received from the photon counting detector 11.

The radiation generator 10 generates radiation for irradiation of a patient. Examples of the radiation generated by the radiation generator 10 may include ultrasound, alpha rays, gamma rays, X-rays, and neutrons. In general, radiation refers to X-rays that may cause ionization and therefore damage to a human body. While the radiation is assumed to be an X-ray for convenience of explanation, it will be understood by those of ordinary skill in the art that other types of radiation may be used in other embodiments.

A pixel region of the photon counting detector 11 corresponds to an imaging region in which the object is to be imaged using radiation. The photon counting detector 11 includes readout circuits, each corresponding to a respective pixel in the pixel region. Since the photon counting detector 11 outputs the result of counting performed by each readout circuit to the image producer 12, the number of the readout circuits in a readout chip corresponding to the respective pixels increases as the number of the pixels in the same imaging region increases. Thus, the image producer 12 may create a high resolution image. In other words, the resolution of an image increases with decreasing a pixel size.

The readout circuits may be arranged in an array within the readout chip. Each readout circuit classifies an electrical signal received from a sensor segment corresponding to the readout circuit according to an energy level of a photon, converts the electrical signal into a digital signal, and outputs the digital signal to the image producer 12. The sensor segment corresponds to a predetermined region of the sensor, and outputs an electrical signal generated from a detected photon to a corresponding readout circuit through a segment output terminal associated with the sensor segment.

A method of reading out an electrical signal received from a sensor segment in a readout circuit may be classified into a charge integration mode and a photon counting mode.

The charge integration mode uses a charge accumulating capacitor in which electrical signals generated for a predetermined time accumulate on the capacitor and are read through an analog-to-digital (A/D) converter. Since this mode allows electrical signals generated from photons of all energy levels to accumulate regardless of energy levels of photons, it is impossible to classify the electrical signals according to the energy levels of photons and convert them into digital signals.

However, a readout circuit operating based on a photon counting mode compares an electrical signal received from a sensor segment for detecting photons with a threshold value to output a digital signal '1' or '0'. This type of readout circuit also counts the number of 1s through a counter and outputs data in a digital form.

In the photon counting mode, a comparator may be used to compare an electrical signal with a predetermined threshold value for counting each time an electrical signal is generated from a single photon. The photon counting detector 11 includes readout circuits realized by using the photon counting mode, wherein each readout circuit corresponding to a respective senor segment classifies photons detected by the sensor segment according to energy levels and counts the number of photons for each energy level.

Figure 2:
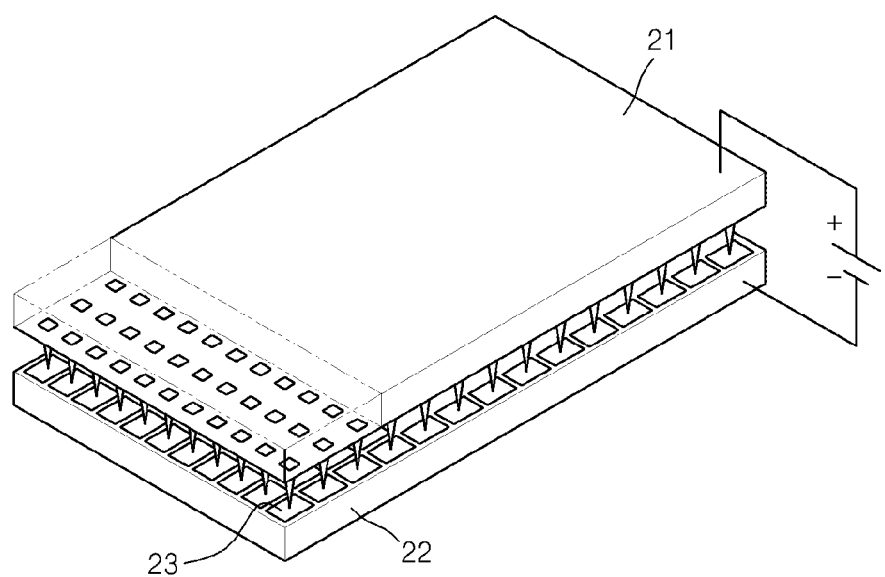
FIG. 2 shows a photon counting detector in the system of FIG. 1.

FIG. 2 shows one embodiment of photon counting detector 11 in the medical imaging system of FIG. 1. Referring to FIG. 2, the photon counting detector 11 includes a sensor 21 and a readout chip 22. The sensor 21 detects a photon contained in multi-energy radiation transmitted through an object such as a human body, generates an electrical signal based on the detected photon, and outputs the electrical signal through a segment output terminal of the sensor 21 to a readout circuit 23 in the readout chip 22 corresponding to a region in which the photon is detected.

That is, sensor 21 corresponding to an imaging region may include a plurality of sensor segments, each corresponding to a respective pixel in the imaging region. The sensor segment generates an electrical signal based on detection of an incident photon and outputs the electrical signal through a segment output terminal associated with the sensor segment. The readout chip 22 corresponding to the imaging region and sensor 21 includes the readout circuits 23, each corresponding to a respective pixel in the imaging region.

Figure 3:
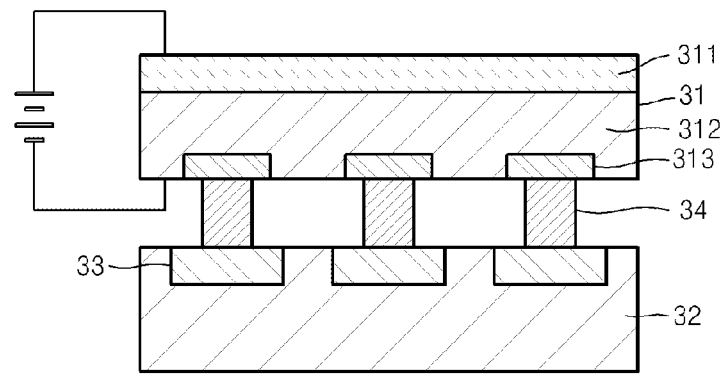
FIG. 3 shows another photon counting detector.

FIG. 3 shows another embodiment of the photon counting detector 11 which includes a sensor 31 and a readout chip 32. The sensor 31 detects a photon, generates an electrical signal based on the detected photon, and outputs the electrical signal to a readout circuit 33 in the readout chip 32 corresponding to each region (sensor segment) in the sensor 31 through a corresponding bonding 34.

More specifically, when a photon enters a depletion region 312 of the sensor 31, the sensor 31 generates an electron-hole pair. The electron-hole pair is then attracted to a quasi-neural n-region 311 and a quasi-neural p-region 313 under an influence of an electric field, thereby allowing current to flow outward. For example, when a multi-energy X-ray is incident on the sensor 31, the sensor 31 may generate an electrical signal having varying magnitudes depending on an energy level of a photon contained in the multi-energy x-ray. The electrical signal may be output to the readout circuit 33 through the quasi-neural p-region 313 corresponding to each region (sensor segment) in the sensor 31.

The quasi-neural p-region 313 may be a segment output terminal associated with each sensor segment of the sensor 31. When a sensor segment corresponding to each pixel in an imaging region detects a photon, the sensor 31 outputs an electrical signal to each readout circuit 33 in the readout chip 32 through a segment output terminal.

The sensor 31 generates a number of electrical signals having different magnitudes depending on energy levels of photons contained in the incident multi-energy X-ray. The number of electrical signals correspond to the number of photons in the multi-energy X-ray.

More specifically, when a photon enters the sensor 31, the sensor 31 generates an electrical signal corresponding to the incident photon. A time interval may exist between the generated electrical signals. According to one embodiment, the time interval between the electrical signals is sufficiently long to allow the energy levels of photons to be classified using electrical signals received from the photon counting detector. On occasion, electrical signals generated by the sensor 31 may have a time interval that is too short to classify and detect the energy level of photons. However, since such a case hardly occurs, this may only slightly affect creation of the entire image.

The sensor 31 in FIG. 3 includes the quasi-neural n-region 311, the depletion region 312, and the quasi-neural p-region 313. However, in other embodiments a different arrangement may be used for the sensor to detect photons. Furthermore, although FIG. 3 shows that the sensor 31 is connected to the readout chip 32 via the bonding 34, in other embodiments the connection may be established via evaporation.

The readout chip 32 includes an array of the readout circuits 33, each corresponding to a respective region in the sensor 31. The readout circuit 33 classifies an energy level of a photon incident on the sensor 31 and counts the number of photons for each energy level by using an electrical signal generated from the photon received from the sensor 31.

The readout circuit 33 also outputs the result of counting to the image producer 12. The image producer 12 creates an image for each pixel based on the result of counting the number of photons in the readout circuit 33 corresponding to the pixel in the imaging region. The readout circuit 33 classifies energy levels of photons contained in the incident multi-energy radiation, outputs a digital signal representing an energy level of a photon according to the classification result, and outputs the number of photons for each energy level. When an electrical signal is received from a sensor segment corresponding to the readout circuit 33, the readout circuit 33 sequentially compares an electrical signal with a predetermined threshold value in order to classify and count the photons according to their energy levels.

The bonding 34 connects the sensor 31 with each of the readout circuits 33 in the readout chip 32 so that an electrical signal generated in a region of the sensor 31 moves to the readout circuit 33 in the readout chip 32. While FIG. 3 shows that the sensor 31 is connected to the readout circuits 33 in the readout chip 32 via the bonding 34, they may be connected to each other by depositing the sensor 31 onto the readout chip 32. It will be also understood by those of ordinary skill in the art that the sensor 31 and the readout circuits 33 may be connected by using other methods than bonding and evaporation.

Figure 4:
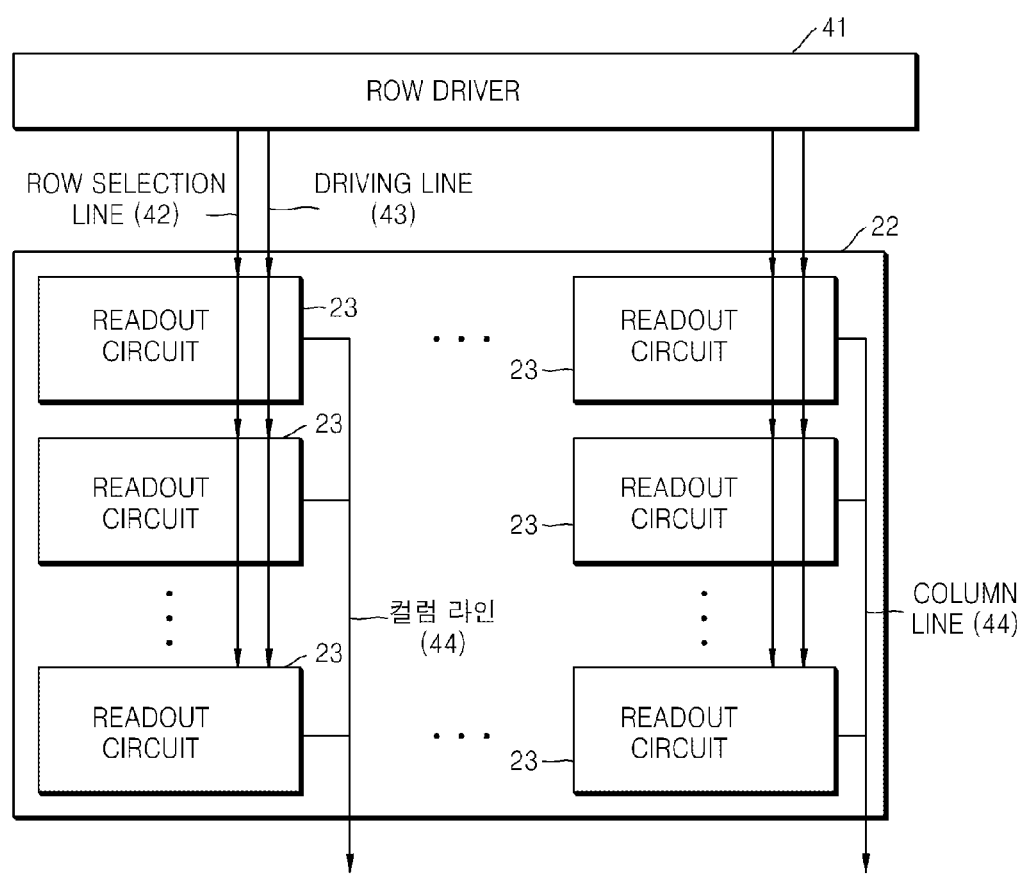
FIG. 4 shows another photon counting detector.

FIG. 4 shows another embodiment of a photon counting detector which includes a row driver 41, row selection lines 42, driving lines 43, column lines 44, and a plurality of readout circuits 23. In this embodiment, the row driver 41 is connected to the row selection lines and the driving lines 43, which are in turn connected to the respective readout circuits 23.

The row driver 41 controls the row controls the operation of the readout circuits 23 through the row selection lines 42. The row driver 41 selects a counter of the readout circuit 23 through the row selection line 42. Information stored in the counter selected by the row driver 41 is output through a corresponding column line 44. The stored information is the result of counting the number of photons.

The row driver 41 controls a driver circuit contained in the readout circuit 23 through a corresponding driving line 43, as described in more detail below with reference to FIGS. 5 through 7.

The readout circuit 23 is controlled by the row driver 41 to output the result of counting the number of photons. More specifically, the readout circuit 23 includes counters for storing the result of counting the number of photons incident on the sensor 21, and is controlled by the row driver 41 to output the results stored in the respective counters through a corresponding column line 44.

The counters in the readout circuit 23 count incoming photons for each energy level. In other words, the readout circuit 23 uses the counters to store the results of counting for each energy level and is controlled by the row driver 41 to output the results of counting for each energy level to the column line 44. The column line 44 is connected to the readout circuits 23 in the readout chip 22. More specifically, the readout circuits 23 at the same column are connected to one of the column lines 44.

Figure 5:
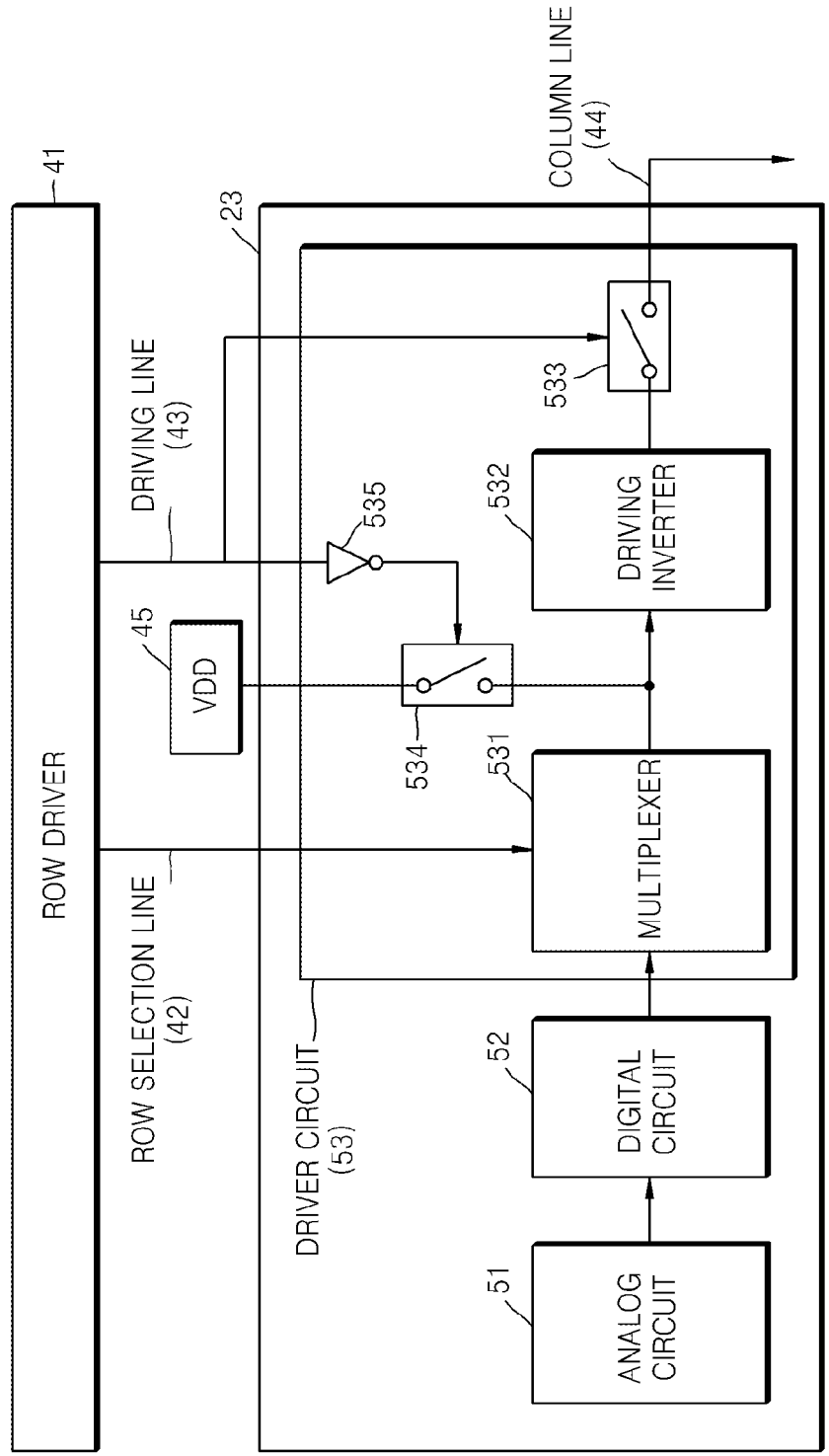
FIG. 5 shows a readout circuit for a photon counting detector.

FIG. 5 shows an embodiment of readout circuit 23 in the photon counting detector 11 of FIG. 2. Referring to FIG. 5, the readout circuit 23 includes an analog circuit 51, a digital circuit 52, and a driver circuit 53.

The analog circuit 51 processes an electrical signal received from the sensor 21 and may include, for example, an integrator and a comparator. The integrator integrates the electrical signal from the sensor 21, and the comparator compares the electrical signal received from the integrator with threshold values. The operation and configuration of the analog circuit 51 will be described in more detail below with reference to FIG. 6.

The digital circuit 52 counts photons for respective energy levels based on a signal received from the analog circuit 51, and includes a signal processor and a counter. The signal processor controls the operation of the integrator according to a signal output from the comparator. The counter counts photons in response to a signal output from the comparator. The operation and configuration of the digital circuit 52 will be described in more detail below with reference to FIG. 6.

The driver circuit 53 outputs the results of counting stored in the counter of the digital circuit 52 to a column line 44. More specifically, the driver circuit 53 is controlled by a row driver 41 to sequentially output the results of counting stored in the counter to the column line 44.

The driver circuit 53 does not operate while the analog circuit 51 or the digital circuit 52 is operating. In other words, the driver circuit 53 operates at a different point in time than the analog or digital circuit 51 or 52. The driver circuit 53 does not operate until the analog or digital circuit 51 or 52 finishes counting all photons.

The driver circuit 53 is also electrically separated from the analog or digital circuit 51 or 52. More specifically, a switch is connected between either the analog or digital circuit 51 or 52 and the driver circuit 53 so that the analog or digital circuit selectively outputs the electrical signal to the driver circuit 53. Thus, the switch is turned off while the analog or digital circuit 51 or 52 is operating, so that the driver circuit 53 is electrically separated from the analog or digital circuit 51 or 52.

An input signal is present on an input node of a driving inverter 532 in the driver circuit 53. This input signal may be continuously present on the input node, or in another embodiment may be present at desired times. When the switch between either the analog or digital circuit 51 or 52 and the driver circuit 53 is turned off, a VDD 45 (voltage source) is connected to an input node of the driving inverter 532. Thus, a constant voltage is maintained at the input node of the driving inverter 532. On the other hand, when the switch is turned on, an output of the digital circuit 52 is fed to the input node of the driving inverter 532.

The row driver 41 controls the driver circuit 53 through a row selection line 42 and a driving line 43 so as to prevent unnecessary power dissipation in the driver circuit 53. The row driver 41 also controls an input signal of the driving inverter 532 in the driver circuit 53 so as to prevent the driving inverter 532 from floating while the driver circuit 53 is not operating. The driving inverter 532 is not floating when its input node is kept high or low. Since unnecessary power dissipation occurs when the driving inverter 532 is floating, the row driver 41 controls the input node of the driving inverter 532 so that the input node is maintained at a high or low level.

When a multiplexer 531 does not operate, no signal is input to the driving inverter 532. In this case, the row driver 41 controls a switch 534 connected to the supply voltage 45 so that the supply voltage 45 is fed to the driving inverter 532. The row driver 41 outputs a low or high signal through the row selection line 42 and the driving line 43. For example, when the driving line 43 is connected to an input of an inverter 535 and the row driver 41 outputs a high signal to the row selection line 42, a high signal is also output through the driving line 43.

The row driver 41 sequentially outputs signals for selecting the counter and bits of the counter through the row selection line 42. Selecting the counter may correspond to outputting the result of counting stored in the counter to the driving inverter 532. Thus, while a signal for selecting the counter is being output through the row selection line 42, a high signal is output through a driving line 43 so as not to connect the supply voltage 45 to the input node of the driving inverter 532. In other words, when a high signal is output through the driving line 43, the switch between the supply voltage 45 and the driving inverter 532 is turned off so as not to connect the supply voltage 45 to the input node of the driving inverter 532.

Figure 6:
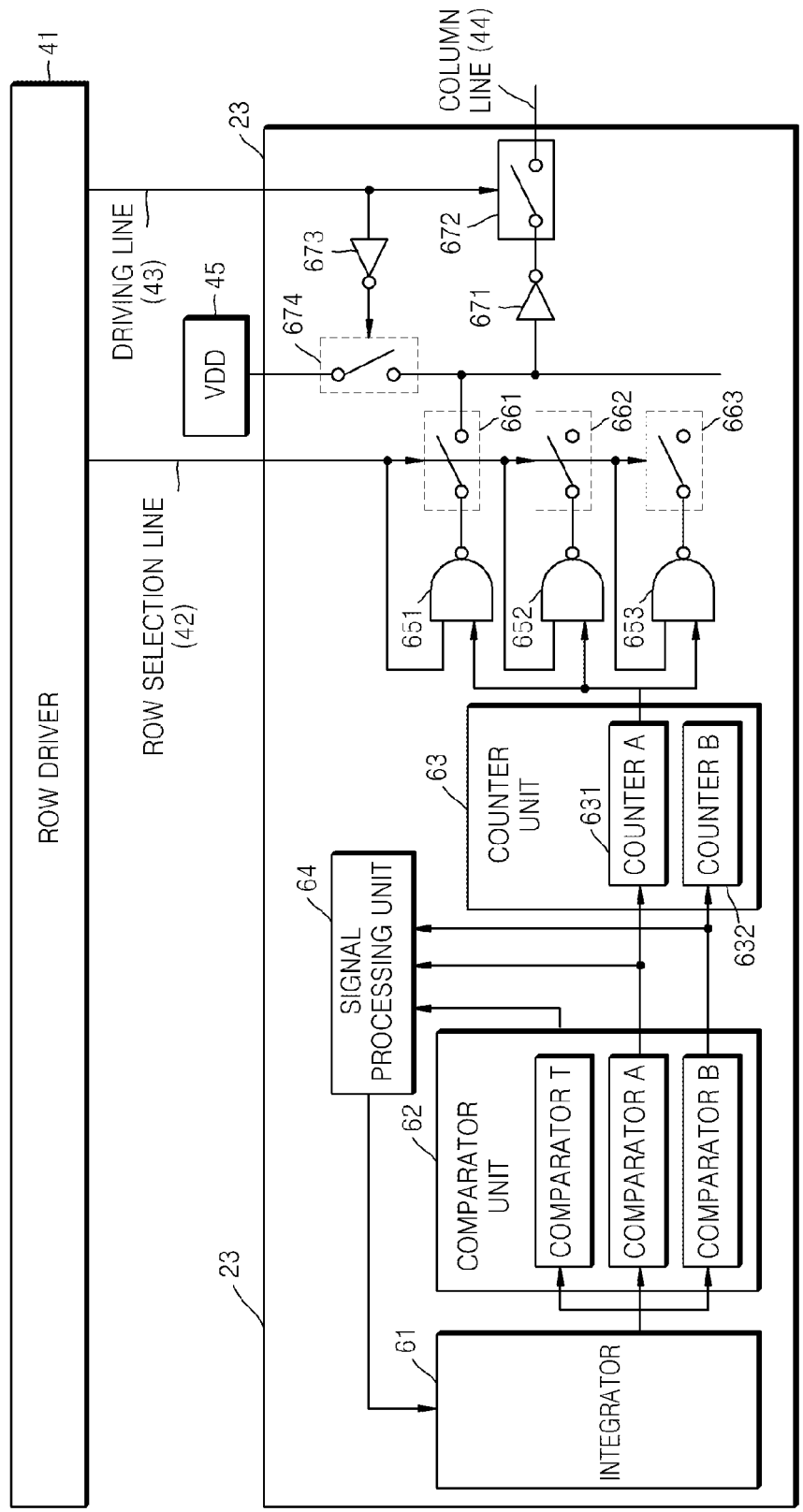
FIG. 6 shows another readout circuit for a photon counting detector.

FIG. 6 shows an embodiment of a readout circuit in the photon counting detector 11 of FIG. 2. Referring to FIG. 6, the readout circuit includes an integrator 61, a comparator unit 62, a counter unit 63, a signal processor 64, a plurality of NAND gates 651 through 653, and a driving inverter 671.

The integrator 61 accumulates an electrical signal received from the sensor 21 and outputs the accumulated electrical signal to a plurality of comparators 621 through 623 in the comparator unit 62.

The comparator unit 62 includes the plurality of comparators 621 through 623 which compare the accumulated electrical signal with threshold values and output the comparison results.

More specifically, the comparator T 621 compares the accumulated electrical signal with a first threshold value and outputs the result to the signal processor 64. The comparator A 622 compares the accumulated electrical signal with a second threshold value and outputs the result to the signal processor 64 and a counter A 631. The comparator B 623 compares the accumulated electrical signal with a third threshold value and outputs the result to the signal processor 64 and a counter B 632. While FIG. 6 shows that the comparator unit 62 includes the three comparators 621 through 623, in other embodiments the number of comparators may vary with the number of energy levels of a photon.

The signal processor 64 uses the comparator T 621 to determine whether the accumulated electrical signal is generated from a photon or due to noise. When the comparator T 621 outputs a high signal while the comparator A 622 and comparator B 623 outputs a low signal, the signal processor 64 determines that the accumulated electrical signal is not generated from a photon and initializes the integrator 61.

The counter unit 63 includes a plurality of counters 631 and 632. The counter A 631 and counter B 632 count signals output from the comparators 622 and 623. For example, the counters 631 and 632 may be N-bit counters. In this case, each of the counter A 631 and the counter B 632 may count photons from 0 to 2N.

Each of the counters 631 and 632 is coupled to NAND gates 651 through 653. While FIG. 6 shows the counter A 631 is connected to the NAND gates 651 through 653 and the driving inverter 671, the counter B 632 may also be connected to separate NAND gates and driving inverter.

While FIG. 6 shows that counter A 631 is connected to the three NAND gates 651 through 653, the number of NAND gates may be determined according to the type of the counter A 631. When the counter A 631 is an N-bit counter as described above, the number of NAND gates may be N.

Bits of the counter A 631 and a signal input via the row selection line 42 are fed to input terminals of the NAND gates 651 through 653. The signal input through the row selection line 42 is used to control switches 661 through 663 respectively coupled to output terminals of the NAND gates 651 through 653. Thus, when the row driver 41 selects one of the NAND gates 651 through 653 through the row selection line 42, a switch connected to an output terminal of the selected NAND gate 651, 652, or 653 is closed.

When a bit of the counter A 631 input to the selected NAND gate 651, 652, or 653 is 0 (low), the NAND gate 651, 652, or 653 outputs a high signal.

When a bit of the counter A 631 input to the selected NAND gate 651, 652, or 653 is 1 (high), the NAND gate 651, 652, or 653 outputs a low signal. The output high or low signal is fed to the driving inverter 671.

While a signal for selecting the NAND gates 651 through 653 is being output sequentially through the row selection line 42, the row driver 41 outputs a high signal through the driving line 43. Since the row driver 41 outputs a high signal through the driving line 43, a supply voltage VDD 45 is not supplied to an input node of the driving inverter 671, and the switch 672 connected to an output terminal of the driving inverter 671 is closed. Thus, signals output from the NAND gates 651 through 653 pass through the driving inverter 671 and are sequentially output to a column line 44.

After finishing selecting the NAND gates 651 through 653 connected to the counter A 631, the row driver 41 outputs a signal for selecting NAND gates (not shown) coupled to the counter B 632. While outputting the signal for selecting the NAND gates coupled to the counter B 632, the row driver 41 outputs a row signal through the driving line 43 so that the supply voltage VDD 45 is supplied to the driving inverter 671 connected to the counter A 631. Thus, the driving inverter 671 is not floating since the supply voltage VDD 45 is supplied to the input node of the driving inverter 671 even while the result of counting stored in the counter A 631 is not being output.

FIG. 7 shows an example of a timing diagram for the switches 661 through 663, 672, and 674 in FIG. 6. In this diagram, on-off operations are shown for switches 661 through 663, 672, and 674. The switches 661 through 663 are coupled to the NAND gates 651 through 653, and the switches 672 and 674 are coupled to the supply voltage VDD 45 and the output terminal of the driving inverter 671, respectively.

A first interval 71 refers to a time interval during which the driver circuit 671 does not operate. In other words, during the first interval, the analog circuit 51 and the digital circuit 52 operate, and photons are counted. At this time, the switch 674 is closed, and the supply voltage VDD 45 is fed into the driving inverter 671.

A second interval 72 refers to a time interval when the result of counting stored in the counter A 631 is output. During the second interval, the switches 661 through 663 are sequentially closed, and the switch 672 is closed so that the result of counting is output to the column line 44 through the driving inverter 671. Conversely, the switch 674 is open, so the supply voltage VDD 45 is not input to the driving inverter 671.

A third interval 73 refers to a time interval occurring after the results of counting stored in the counter A 631 are all output. During the third interval 73, the results of counting stored in counters other than the counter A 631 are output. At this time, the switch 674 is closed, and the supply voltage VDD 45 is input to the driving inverter 671.

During the first and third intervals 71 and 73, the driving inverter 671 does not operate. In other words, the results of counting stored in the counter A 631 is not output to the driving inverter 671 at the first and third intervals 71 and 73. Thus, since the input node of the driving inverter 671 has to be maintained low or high, the switch 674 is closed so that the input node of the driving inverter 671 is kept at a high level.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A driver circuit for outputting a result of classifying and counting photons according to energy level to a column line, the circuit comprising:
    a multiplexer configured to receive a result from a counter, the multiplexer configured to output a first signal based on the result from the counter;
    a first inverter configured to receive the first signal from the multiplexer and a second signal from a power supply, the first inverter configured to output a third signal to the column line based on receiving the first signal; and
    a first switch coupled between the power supply and an input terminal of the first inverter, the first switch being external to the multiplexer, the first switch and the multiplexer being directly coupled to the input terminal of the first inverter, the first switch being configured to selectively supply the second signal from the power supply to the first inverter.

2. The circuit of claim 1, further comprising:
    a second switch coupled to an output terminal of the first inverter.

3. The circuit of claim 1, further comprising:
    a second inverter configured to output a signal controlling the first switch.

4. The circuit of claim 3, further comprising:
    a second switch coupled to the output terminal of the first inverter, wherein the input terminal of the first inverter is coupled to a driving line to which a signal for controlling the second switch is input.

5. The circuit of claim 1, wherein the multiplexer includes a plurality of NAND gates configured to receive bit signals of the counter.

6. The circuit of claim 5, wherein the multiplexer includes a plurality of third switches, each separate third switch being coupled to an output terminal of a separate NAND gate of the plurality of NAND gates.

7. The circuit of claim 6, wherein each bit signal of the counter and a signal for controlling the third switches are fed to input terminals of the NAND gates.

8. The circuit of claim 6, wherein the third switches are coupled between the NAND gates and the input terminal of the first inverter.

9. The circuit of claim 1, wherein the first switch is turned off while the multiplexer is operating.

10. The circuit of claim 1, wherein the first switch is turned on while the multiplexer is not operating.

11. The circuit of claim 1, wherein the first inverter is configured to receive the signal from the multiplexer at a first time and a power signal from the power supply at a second time different from the first time.

12. The circuit of claim 11, wherein the first time and the second time are consecutive times.

13. The circuit of claim 11, wherein the first inverter is in a state different from a floating state based on the power signal received at the second time.

14. A readout circuit comprising:
an analog circuit configured to classify photons incident on a sensor according to one or more energy levels;
a digital circuit configured to count the photons based on a signal received from the analog circuit; and
a driver circuit configured to output a result of counting determined by the digital circuit to a column line, the driver circuit configured to operate at a different time than at least one of the analog or digital circuit, the driver circuit comprising:
a multiplexer configured to receive a result of counting from the digital circuit, the multiplexer configured to output a first signal based on the result of counting from the digital circuit;
a first inverter configured to receive the first signal from the multiplexer and a second signal from a power supply, the first inverter configured to output a third signal to the column line based on receiving the first signal; and
a first switch coupled between the power supply and an input node of the first inverter, the first switch being external to the multiplexer, the first switch and the multiplexer being directly coupled to the input terminal of the first inverter, the first switch being configured to selectively supply the second signal from the power supply to the first inverter.

15. The circuit of claim 14, wherein the driving inverter is electrically separated from the analog or digital circuit.

16. The circuit of claim 14, wherein the driver circuit includes a plurality of driving inverters corresponding to counters in the digital circuit, the plurality of driving inverters configured to operate at different times from each other.

17. A non-transitory computer readable medium comprising a plurality of instructions, the plurality of instructions, when executed by one or more processors, is configured to cause the one or more processors to:
control an analog circuit to classify photons incident on a sensor according to one or more energy levels;
control a digital circuit to count the photons based on a signal received from the analog circuit; and
control a driver circuit to output a result of counting determined by the digital circuit to a column line,
control the driver circuit to operate at a different time than at least one of the analog or digital circuit, the driver circuit comprising:
a multiplexer configured to receive a result of counting from the digital circuit, the multiplexer configured to output a first signal based on the result of counting from the digital circuit;
a first inverter configured to receive the first signal from the multiplexer and a second signal from a power supply, the first inverter configured to output a third signal to the column line based on receiving the first signal; and
a first switch coupled between the power supply and an input node of the first inverter, the first switch being external to the multiplexer, the first switch and the multiplexer being directly coupled to the input terminal of the first inverter, the first switch being configured to selectively supply the second signal from the power supply to the first inverter.

18. The non-transitory computer readable medium of claim 17, wherein the driving inverter is electrically separated from the analog or digital circuit.

19. The non-transitory computer readable medium of claim 17, wherein the plurality of instructions, when executed by the one or more processors, is configured to cause the one or more processors to control the input node to receive a constant voltage while the analog or digital circuit is operating.

20. The non-transitory computer readable medium of claim 17, wherein the driver circuit includes a plurality of driving inverters corresponding to counters in the digital circuit, and wherein the plurality of instructions, when executed by the one or more processors, is configured to cause the one or more processors to control the plurality of driving inverters to operate at different times from each other.

21. The non-transitory computer readable medium of claim 17, wherein the plurality of instructions, when executed by the one or more processors, is configured to cause the one or more processors to control the driver circuit to receive the signal from the digital circuit at a first time and a power signal from the power supply at a second time different from the first time.

* * * * *